US006878624B1

United States Patent
Bruley et al.

(10) Patent No.: US 6,878,624 B1
(45) Date of Patent: Apr. 12, 2005

(54) PRE-ANNEAL OF COSI, TO PREVENT FORMATION OF AMORPHOUS LAYER BETWEEN TI-O-N AND COSI

(75) Inventors: John Bruley, Poughkeepsie, NY (US); Cyril Cabral, Jr., Ossining, NY (US); Christian Lavoie, Ossining, NY (US); Tina J. Wagner, Newburgh, NY (US); Yun Yu Wang, Poughgaug, NY (US); Horati S. Wildman, Wappingers Falls, NY (US); Wong Kwong Hon, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/674,645

(22) Filed: Sep. 30, 2003

(51) Int. Cl.[7] .......................... H01L 21/44; H01L 23/52
(52) U.S. Cl. ...................................... 438/655; 174/68.1
(58) Field of Search ................................ 438/642–643, 438/648–649, 652–653, 655–656; 174/68.1

(56) References Cited

U.S. PATENT DOCUMENTS

| 4,926,237 A | * | 5/1990 | Sun et al. ................... 257/764 |
| 5,047,367 A | * | 9/1991 | Wei et al. ................... 438/607 |
| 5,880,018 A | | 3/1999 | Boeck et al. |
| 6,271,122 B1 | * | 8/2001 | Wieczorek et al. .......... 438/627 |
| 6,346,465 B1 | * | 2/2002 | Miura et al. ................. 438/542 |
| 6,406,994 B1 | | 6/2002 | Ang et al. |

OTHER PUBLICATIONS

Ebbing et al., General Chemistry, 3rd Edition, 1990, Houghton Mifflin Company, inside front cover (i.e. 2 pages of inside front cover entitled "Periodic Table of Elements").*

* cited by examiner

Primary Examiner—Evan Pert
(74) Attorney, Agent, or Firm—Scully, Scott, Murphy & Presser; Wan Yee Cheung, Esq.

(57) ABSTRACT

The present invention provides a method for forming an interconnect to a cobalt or nickel silicide having a TiN diffusion barrier. The inventive method comprises providing an initial structure having vias to exposed silicide regions positioned on a substrate; annealing the initial structure in a nitrogen-containing ambient, wherein a nitrogen passivation layer is formed atop the exposed silicide region; depositing Ti atop the nitrogen passivation layer; annealing the Ti in a nitrogen-containing ambient to form a TiN diffusion barrier and an amorphous Ti cobalt silicide between the TiN diffusion layer and the cobalt or nickel silicide and depositing an interconnect metal within the vias and atop the TiN diffusion barrier. The nitrogen passivation layer substantially restricts diffusion between the Ti and silicide layers minimizing the amorphous Ti cobalt silicide layer that forms. Therefore, the amorphous Ti cobalt or Ti nickel silicide is restricted to a thickness of less than about 3.0 nm.

20 Claims, 4 Drawing Sheets

US 6,878,624 B1

PRE-ANNEAL OF COSI, TO PREVENT FORMATION OF AMORPHOUS LAYER BETWEEN TI-O-N AND COSI

FIELD OF INVENTION

The present invention relates to semiconductor devices and a method of manufacture, more particularly to an improved via interconnect to a silicide region.

BACKGROUND OF THE INVENTION

Barrier layers and silicide layers are often an integral part of semiconducting devices. Materials which function as barriers to metal diffusion may be incorporated in metal interconnect structures that are part of integrated circuits (ICs). Barriers to metal diffusion are typically required to generate reliable devices, since low-k interlayer dielectrics typically do not prohibit metal diffusion.

Silicide contacts are of specific importance to IC's, including complementary metal oxide semiconductor (CMOS) devices because of the need to reduce the electrical resistance of the many Si contacts, at the source/drain and gate regions, in order to increase chip performance. Silicides are metal-silicon compounds that are thermally stable and provide for low electrical resistivity at the Si/metal interface. Silicides improve resistivity by providing ohmic contacts to the Si surface during silicide formation. Reducing contact resistance improves device speed therefore increasing device performance.

Forming devices having a titanium oxynitride diffusion barrier atop a cobalt silicide has presented difficulty when processed with corresponding tungsten vias. First, a cobalt silicide region is formed by depositing cobalt atop a silicon substrate and then annealing the structure to promote inter-diffusion of cobalt with the substrate. The unreacted cobalt is then stripped and a layer of titanium is deposited atop the cobalt silicide. The titanium layer is conventionally processed to produce a silicide contact and a diffusion barrier.

More specifically, titanium is deposited atop the silicide and then treated by a nitrogen-containing forming gas anneal. The nitrogen-containing forming gas anneal produces a titanium nitride layer, or a titanium oxynitride layer, at a top surface of the titanium metal layer and produces an amorphous titanium cobalt oxygen silicide layer at the interface between the titanium layer and the cobalt silicide.

Referring to FIG. 1, the amorphous titanium cobalt oxygen silicide 5 is formed in regions in which titanium diffusing down from the titanium layer reacts with the underlying cobalt silicide 6 and layer of $SiO_x$ on Co silicide surface. A remaining unreacted portion 8 of the titanium layer is positioned between the amorphous titanium cobalt silicide 5 and the titanium nitride layer 7. Due to differing atomic radii of titanium and the silicon, of the cobalt silicide 6, they cannot replace each other in the atomic structure and therefore produce an amorphous layer. During conventional annealing, a thick amorphous titanium cobalt oxygen silicide layer 5 is formed. The increasing thickness $T_\alpha$ of the amorphous titanium cobalt oxygen silicide 5 results in a thinned ($T_\beta$) titanium nitride layer 7. Thinning of the titanium nitride layer 7 occurs because as the titanium diffuses and is adsorbed in the cobalt silicide 6 the amount of titanium available for forming the titanium nitride diffusion barrier 7 is reduced. If the amorphous layer adsorbs too much titanium and becomes greater than 4.0 nm in thickness $T_\alpha$, the titanium nitride layer 7 becomes too thin to be effective as a barrier. The titanium nitride diffusion barrier 7 must maintain a thickness to be effect as a barrier to protect the underlying silicide layer 6 during later processing steps.

Following the formation of the titanium nitride diffusion barrier, tungsten interconnects are formed by depositing tungsten through chemical vapor deposition with a tungsten hexaflouride precursor gas. If the titanium nitride diffusion barrier layer is too thin to be an effective barrier to fluorine, the fluorine may attack the underlying amorphous titanium cobalt silicide layer resulting in a ruptured via producing an electrically open circuit.

The above phenomenon is equally applicable to nickel silicide and barrier layers comprising hafnium or zirconium, where the difference in atomic radii of the elements in the barrier layer and underlying silicide results in the formation of an amorphous silicide interlayer.

In view of the above, a method for forming a via interconnect to a silicide region having an effective diffusion barrier positioned between the via interconnect and the underlying silicide is needed.

SUMMARY OF THE INVENTION

It is an object of the present invention to form a via interconnect to a silicide region comprising cobalt or nickel, where an effective barrier layer comprising a group IVA metal nitride, e.g., titanium nitride, hafnium nitride, or zirconium nitride, is positioned between the silicide and via interconnect, wherein all references to the Group IVA notation complies with and refers to IUPAC Group IVA notation which includes, for example, titanium, zirconium and halfnium.

One aspect of the present invention is a method for producing a contact comprising the steps of:

forming a Co or Ni silicide contact positioned on a substrate;

annealing the Co or Ni silicide in an ambient comprising nitrogen, wherein a nitrogen passivation layer is formed on the Co or Ni silicide;

depositing a Group IVA metal layer atop the nitrogen passivation layer, and annealing the Group IVA metal layer, the nitrogen passivation layer, and the Co or Ni silicide, wherein the nitrogen passivation layer substantially restricts the diffusion of metals from said Group IVA metal layer.

Another aspect of the present invention is a method for forming an interconnect comprising the steps of:

providing an initial structure having vias to exposed silicide regions positioned on a substrate;

annealing the initial structure in a nitrogen-containing ambient, wherein a nitrogen passivation layer is formed atop the exposed silicide region;

depositing a Group IVA metal layer atop the nitrogen passivation layer;

annealing the Group IVA metal layer in a nitrogen-containing ambient to form a Group IVA metal nitride diffusion barrier and an amorphous metal silicide, having a thickness of about 3.0 nm or less, between the metal nitride diffusion layer and the silicide, wherein the nitrogen passivation layer substantially restricts diffusion of the metal elements from the Group IVA metal layer; and depositing an interconnect metal within the vias and atop the metal nitride diffusion barrier.

The above methods overcome thinning of the metal nitride diffusion barrier by annealing the silicide in an ammonia gas atmosphere (ammonia bake) to form a nitride passivation surface atop the exposed silicide, where the nitrogen passivates the silicide surface. During an ammonia bake, at a temperature of about 550° C., the silicide surface adsorbs nitrogen molecules or atoms forming the nitrogen passivation layer. The ammonia bake annealing atmosphere comprises 100% $NH_4$. The time period for the ammonia bake may be approximately 30 minutes.

The nitrogen passivation layer may have an atomic or subatomic level thickness. The nitrogen passivation layer may include a single monolayer or be multiple monolayers of nitrogen. A monolayer is a single layer of molecules or atoms adsorbed upon a surface. Typically, silicon from the silicide bonds with oxygen from a $SiO_x$ surface layer. The present invention replaces oxygen at the surface by utilizing a nitrogen-containing annealing step. The nitrogen is adsorbed by the silicide surface forming a nitrogen passivation layer having an atomic level thickness.

Following the formation of the nitrogen passivation layer, metal is thereafter deposited atop the nitrogen passivation layer using conventional deposition methods. The deposited metal forms a layer comprising titanium, hafnium, zirconium, or combinations thereof. During subsequent anneal process steps, the nitrogen passivation layer slows the reaction between diffusing elements from the metal layer and the underlying silicide. By slowing the reaction between the diffusing metal and the silicide, a thinner amorphous Group IVA metal silicide layer is produced and a thicker metal nitride diffusion barrier layer is maintained. The amorphous metal silicide layer may comprise titanium cobalt silicide, titanium nickel silicide, hafnium cobalt silicide, hafnium nickel silicide, zirconium cobalt silicide, and zirconium nickel silicide. The diffusion barrier may comprise titanium nitride, hafnium nitride, or zirconium nitride. The amorphous metal silicide layer as well as the diffusion barrier layer may also contain oxygen. Therefore, since the diffusion barrier layer may be thicker, it may be more effective as a barrier layer during CVD tungsten deposition from a tungsten hexaflouride precursor.

DETAILED DESCRIPTION OF THE INVENTION

Figure 1:
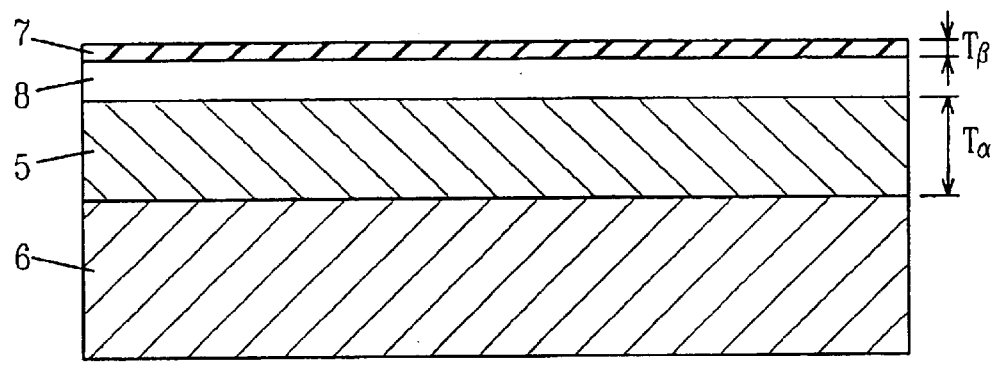
FIG. 1 depicts, through cross sectional views, a prior art structure having a thin ineffective barrier layer and thick amorphous metal silicide.

The inventive method for forming a low resistance via will now be discussed in greater detail referring to the drawings accompanying the present invention. It is noted in the accompanying drawings like and corresponding elements are referred to by like reference numbers.

Figure 2:
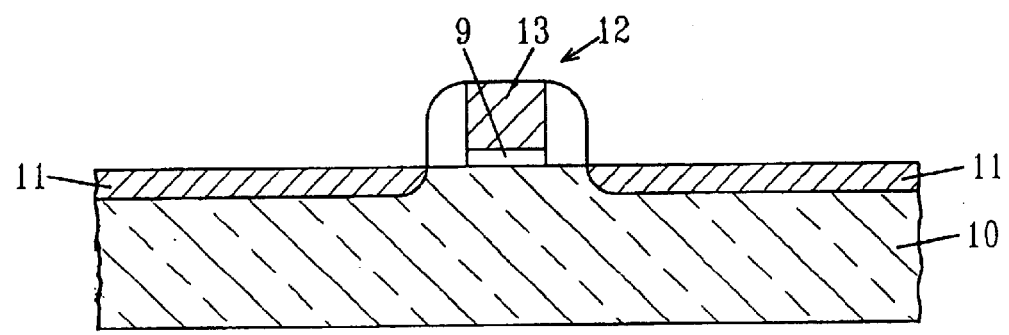
FIG. 2 depicts, through cross sectional views, the structure produced by initial processing steps including a gate region atop a substrate having source and drain regions.

Referring to FIG. 2, a substrate 10 of silicon-containing material is first provided. Silicon-containing materials include, but are not limited to: silicon, single crystal silicon, polycrystalline silicon, silicon germanium, silicon-on-silicon germanium, amorphous silicon, silicon-on-insulator (SOI), silicon germanium-on-insulator (SGOI), and annealed polysilicon. The substrate may further comprise the source/drain regions 11 and gate region 12 of a complementary metal oxide semiconducting device. The gate region 12 may include a gate dielectric 9 and polysilicon gate conductor 13.

Figure 3:
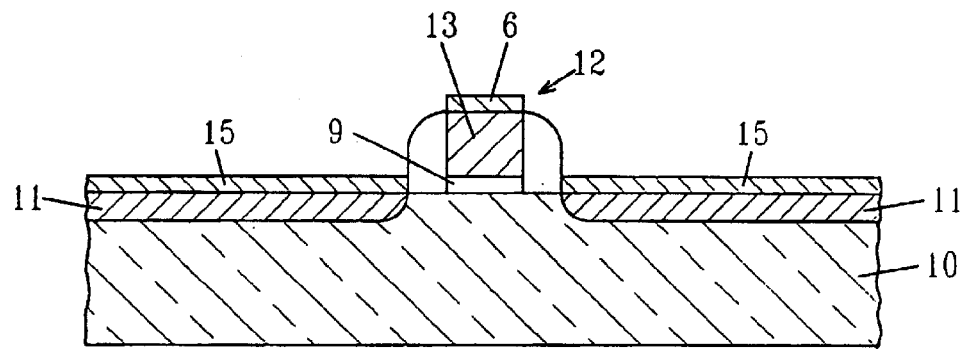
FIG. 3 depicts, through cross sectional views, the structure produced by initial processing steps further comprising silicide regions.

Referring to FIG. 3, a silicide region 15 is then formed atop the source and drain regions 11. A gate silicide region 6 also forms atop the gate polysilicon region 13. Silicide formation typically requires depositing a metal, preferably cobalt, onto the exposed surface of a silicon-containing material. Alternatively, the metal may be nickel. Following deposition, the structure is then subjected to an annealing step using conventional processes including, but not limited to: rapid thermal annealing. The first anneal is completed at a temperature ranging from about 350° C. to about 600° C. for a time period ranging from about 1 second to about 90 seconds. During thermal annealing, the deposited metal reacts with silicon forming a metal silicide. The unreacted metal positioned on $SiO_2$ and $Si_3N_4$ regions is then stripped leaving the metal silicide region untouched. An optional second anneal may be needed to reduce the resistivity of the silicide. This second anneal temperature ranges from 600° C. to 800° C. for a time period ranging from 1 second to 60 seconds.

Figure 4:
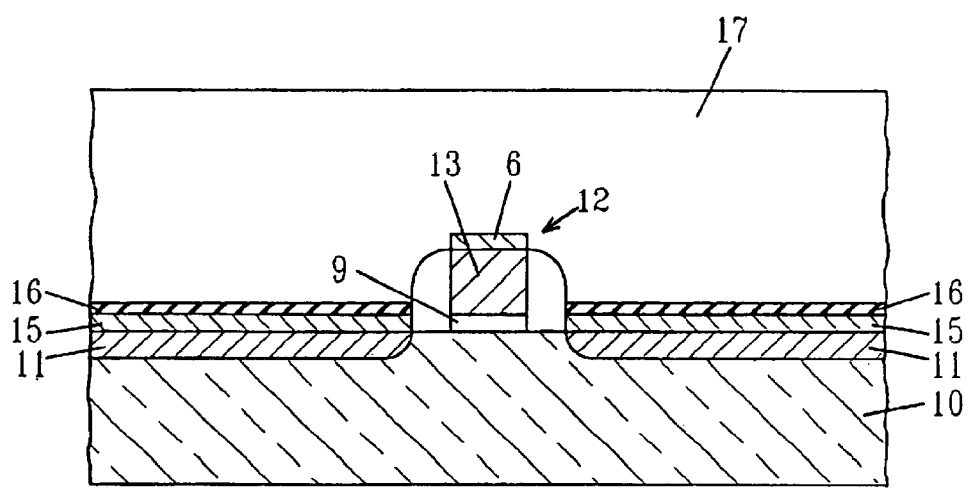
FIG. 4 depicts, through cross sectional view, the structure of FIG. 3 further comprising a silicon nitride layer atop the silicide layer and a layer of dielectric material atop the silicon nitride layer and gate region.

Now referring to FIG. 4, an etch stop layer 16 may then be deposited using conventional deposition methods including, but not limited to: chemical vapor deposition (CVD), plasma-assisted CVD, low pressure chemical vapor deposition (LPCVD) and high-density chemical vapor deposition (HDCVD). The etch stop layer 16, may typically comprise nitride materials, preferably being $Si_3N_4$. The etch stop layer 16 typically has a thickness of approximately 1–50 mm. The etch stop layer 16 functions as an etch stop to protect the underlying silicide during via formation.

Following etch stop layer 16 formation, a dielectric layer 17 is formed as depicted in FIG. 4. The dielectric material 17 may be silicon dioxide, spin-on glass, polyimide, a diamond-like material or a low-k material having a dielectric constant less than 4.0, etc. Preferably, the dielectric layer 17 is boron-phosphorous-silicate glass (BPSG) or high density plasma oxide (HDP oxide). The dielectric layer 17 may be formed by spin-on-dielectric, spin-on-glass technology or chemical vapor deposition (CVD). The thickness of the dielectric layer 17 may range from about 50 nm to about 200 nm. The dielectric layer 17 is then planarized by chemical mechanical polishing or equivalent techniques.

Figure 5:
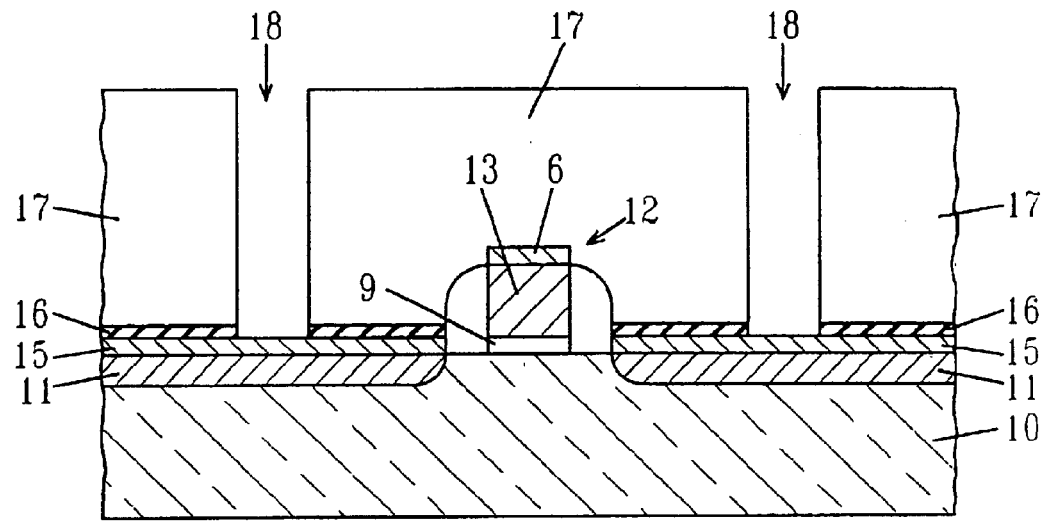
FIG. 5 depicts, through cross sectional view, the structure of FIG. 4 where vias have been formed in the dielectric layer to expose a portion of the underlying silicide.

Referring now to FIG. 5, via openings 18 are then formed through the dielectric layer 17 to the silicide regions 15 using conventional photolithography and reactive ion etching (RIE) process steps. Specifically, a pattern is produced by applying a photoresist to the surface to be etched; exposing the photoresist to a pattern of radiation; and then developing the pattern into the photoresist utilizing conventional resist developer.

Once the patterning of the photoresist is completed, the sections covered by the photoresist are protected, while the exposed regions are removed using a selective etching process that removes the unprotected regions. More specifically, following the patterning of the dielectric layer 17 via openings 18 are formed by reactive ion etching which selectively etches the dielectric layer 17 without etching the etch stop layer 16. Etch stop layer 16 is then etched to the underlying silicide region 15.

Figure 6:
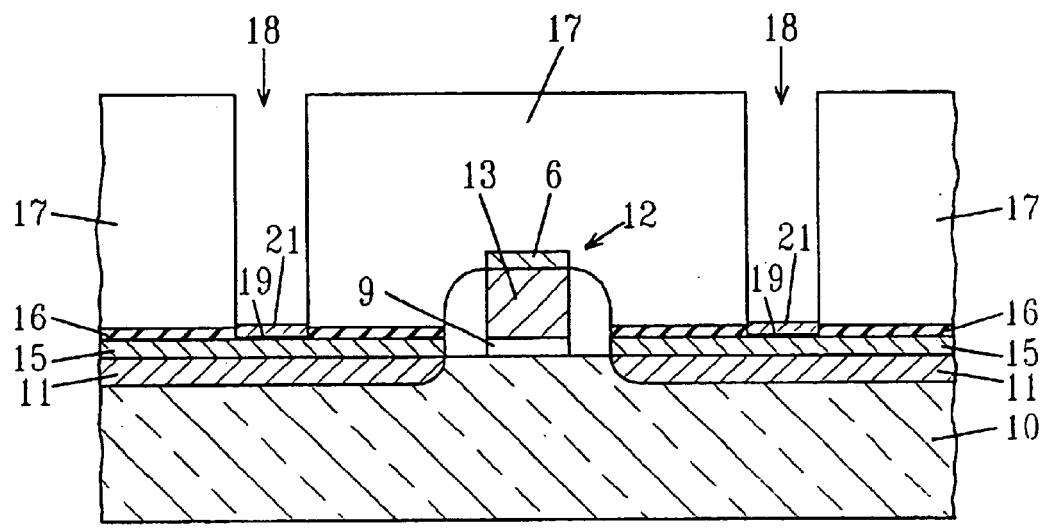
FIG. 6 depicts, through cross sectional view, the structure of FIG. 5 where a nitrogen passivation layer has been formed within the via atop the exposed portion of the silicide.

The exposed silicide surfaces are then treated in a nitrogen-containing atmosphere to form a nitrogen passivation layer 19, as depicted in FIG. 6. The nitrogen-containing atmosphere forming nitrogen passivation layer 19 may comprise ammonia. For example, during an ammonia bake, the exposed silicide surface within via opening 18 is subjected to a 100% ammonia ($NH_4$) atmosphere at a temperature of about 450° C. to about 650° C. for approximately 15 to 90 minutes. Nitrogen introduced from the ammonia atmosphere bonds with silicon atoms of the exposed silicide 15 during the formation of the nitrogen passivation layer 19.

The silicide surface adsorbs an atomic level thickness layer of molecules or atoms of nitrogen during the ammonia bake forming the nitrogen passivation layer 19. The thickness of the nitrogen passivation layer 19 may be less than 30.0 Å, preferably ranging from about 10.0 Å to about 15.0 Å. The nitrogen passivation layer 19 may be sub-monolayer, single monolayer or multiple monolayers. A monolayer is a single layer of molecules or atoms.

Alternatively, the nitrogen passivation layer 19 may be formed using plasma chemical vapor deposition or plasma physical deposition. Plasma chemical vapor deposition may occur at room temperature in the presence of a nitrogen/hydrogen plasma. The nitrogen passivation layer 19 may also be deposited using atomic layer deposition.

A metal layer 21 comprising metals selected from Group IVA, using IUPAC Group IVA notation, of the Periodic Table of Elements is then deposited using conventional deposition techniques including, but not limited to: chemical vapor deposition (CVD), plasma-assisted CVD, high density chemical vapor deposition (HDCVD), plating, sputtering, evaporation and chemical solution deposition. Group IVA of the Periodic Table of Elements may include titanium, hafnium, zirconium, and combinations thereof. Following deposition, the structure is then annealed in nitrogen-containing forming gas at a temperature of about 450° to 650° C. for 15 to 90 min.

Figure 7:
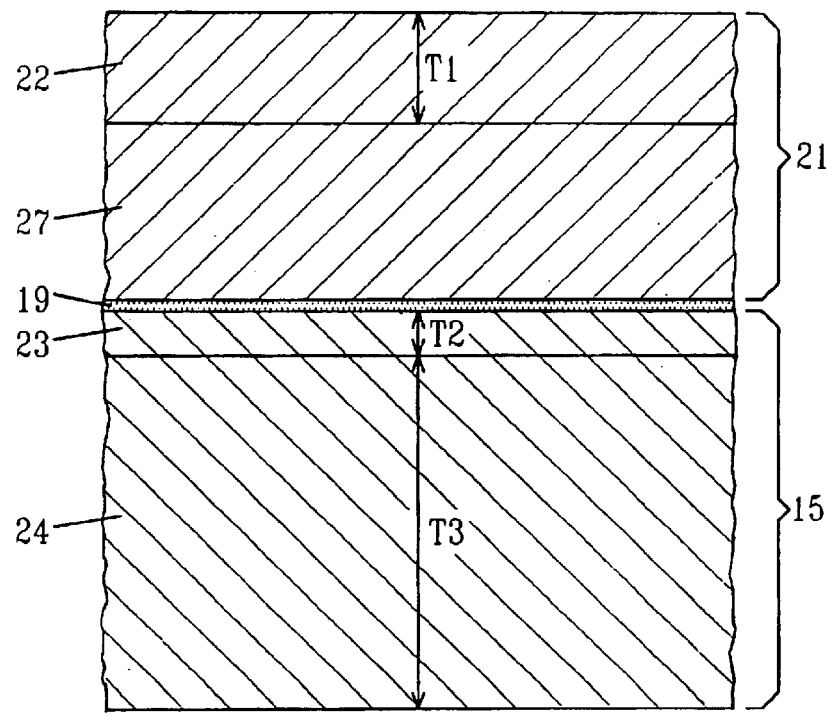
FIG. 7 depicts, through cross sectional view, the diffusion barrier, amorphous silicide and cobalt silicide stack.

Referring now to FIG. 7, during the anneal processing step the metal layer 21 reacts to form a metal nitride diffusion barrier 22 and an amorphous metal silicide layer 23. The top surface of the metal layer 21 reacts with the nitrogen in the nitrogen-containing forming gas to form a metal nitride diffusion barrier 22 having a thickness T1 ranging from about 5.0 nm to about 10.0 nm. The lower surface of the metal layer 21 reacts with the underlying nitrogen passivation layer 19 and the underlying silicide 15 to form an amorphous metal silicide layer 23.

The amorphous metal silicide layer 23 may comprise titanium cobalt silicide, titanium nickel silicide, hafnium cobalt silicide, hafnium nickel silicide, zirconium cobalt silicide, and zirconium nickel silicide. The amorphous metal silicide layer 23 may further comprise oxygen, e.g., titanium cobalt oxide silicide, titanium nickel oxide silicide, hafnium cobalt oxide silicide, hafnium nickel oxide silicide, zirconium cobalt oxide silicide, and zirconium nickel oxide silicide.

The metal nitride diffusion barrier 22 may comprise titanium nitride, hafnium nitride, or zirconium nitride. The metal nitride diffusion barrier 22 may further comprise oxygen, e.g., titanium oxynitride, hafnium oxynitride, or zirconium oxynitride.

The nitrogen passivation layer 19 slows the reaction forming the amorphous metal silicide layer 23 by slowing the diffusion of the elements between the metal layer 21 and the underlying silicide 15. By slowing the diffusion of elements, the thickness T2 of the amorphous metal silicide layer 23 may be limited to less than approximately 3.0 nm, preferably less than 2.0 run, most preferably ranging from about 1.0 nm to about 2.0 nm. During the forming gas anneal, the nitrogen passivation layer 19 dissipates into the amorphous metal silicide 23. The remaining silicide 24 that is positioned below the amorphous metal silicide 23 functions as a contact and has a thickness T3 ranging from about 15.0 nm to about 50.0 nm. In a preferred embodiment, the metal nitride diffusion barrier 22 is TiN, the amorphous metal silicide 23 is titanium cobalt oxygen silicide, and the silicide 15 is cobalt silicide.

Figure 8:
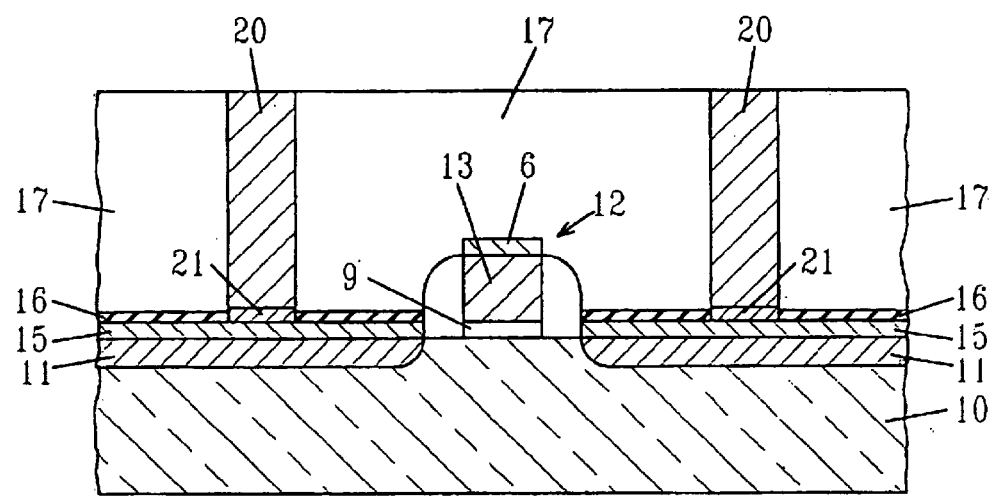
FIG. 8 depicts, through cross sectional view, the structure of FIG. 6 further comprising a via interconnect.

In a next process step, a via interconnect 20 is formed by depositing a conductive material such as a metal selected from, but not limited to: tungsten, iridium, rhenium, ruthenium, platinum, molybdenum, aluminum, copper, titanium, tantalum, hafnium, niobium, and nickel. The via interconnect material may be deposited using the following deposition techniques including, but not limited to: chemical vapor deposition (CVD), plasma-assisted CVD, high-density chemical vapor deposition (HDCVD), plating, sputtering, evaporation and chemical solution deposition. Preferably, the via interconnect 20 is formed of tungsten using a tungsten hexaflouride precursor gas. The metal nitride diffusion barrier 22 acts as a barrier to excess fluorine and protects the underlying layers. The via interconnect is depicted in FIG. 8.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a contact comprising:
   forming a Co or Ni silicide positioned on a substrate;
   forming a nitrogen passivation layer on said Co or Ni silicide;
   depositing a Group IVA metal layer atop said nitrogen passivation layer; and
   annealing said Group IVA metal layer, said nitrogen passivation layer, and said Co or Ni silicide, wherein said nitrogen passivation layer substantially restricts diffusion between said metal layer and said Co or Ni silicide.

2. The method of claim 1 wherein said forming said nitrogen passivation layer comprises annealing said Co or Ni silicide in a nitrogen-containing ambient.

3. The method of claim 2 wherein said annealing of said Co or Ni silicide in said nitrogen-containing ambient at a temperature of about 450° C. to 650° C. and for about 15 to 90 minutes, and said nitrogen-containing ambient is $NH_4$.

4. The method of claim 1 wherein said Group IVA metal layer comprises titanium, hafnium or zirconium.

5. The method of claim 1 wherein said annealing said Group IVA metal layer comprises forming an upper metal nitride diffusion barrier and a lower amorphous metal silicide layer from said metal layer.

6. The method of claim 5 wherein said lower amorphous metal silicide layer has a thickness of less than about 3.0 nm.

7. The method of claim 1 wherein said forming a nitrogen passivation layer comprises atomic layer deposition, plasma chemical vapor deposition or plasma physical deposition.

8. A method for forming an interconnect comprising:

providing an initial structure having vias to expose a Co or Ni silicide region positioned on a substrate;

forming a nitrogen passivation layer atop said Co or Ni silicide region;

depositing a Group IVA metal layer atop said nitrogen passivation layer;

annealing said Group IVA metal layer in a nitrogen-containing ambient to form a metal nitride diffusion barrier and an amorphous metal silicide, wherein said nitrogen passivation layer substantially restricts diffusion between said metal layer and said amorphous metal silicide; and depositing an interconnect metal within said vias and atop said metal nitride diffusion barrier.

9. The method of claim 8 wherein said annealing said metal layer in nitrogen-containing ambient further comprises forming an amorphous metal silicide having a thickness of about 3.0 nm or less between said metal nitride diffusion barrier and said Co or Ni silicide region.

10. The method of claim 8 wherein said interconnect metal is selected from the group consisting of W, Ir, Re, Ru, Pt, Al, and Cu.

11. The method of claim 10 wherein said interconnect metal is tungsten formed from tungsten hexaflouride precursor gas, wherein said metal nitride diffusion barrier protects said Co or Ni silicide and said amorphous metal silicide.

12. The method of claim 8 wherein said nitrogen passivation layer is formed by annealing said initial structure having vias to expose said Co or Ni silicide region at a temperature of about 450° C. to about 650° C. and for about 15 to 90 minutes in a nitrogen-containing ambient.

13. The method of claim 12 wherein said nitrogen-containing ambient is $NH_4$.

14. The method of claim 8 wherein said nitrogen passivation layer has a thickness of less than approximately 30.0 Å.

15. The method of claim 8 wherein annealing said Group IVA metal layer dissipates said nitrogen passivation layer.

16. The method of claim 8 wherein said metal nitride diffusion barrier comprises titanium nitride, hafnium nitride, or zirconium nitride.

17. A via interconnect silicide junction comprising:

a substrate having a Co or Ni silicide region;

an amorphous metal silicide region atop said silicide region having a thickness of less than about 3.0 nm;

a metal nitride diffusion barrier atop said amorphous metal silicide region; and an interconnect in electrical contact with said Co or Ni silicide.

18. The via interconnect of claim 17 wherein said metal nitride diffusion barrier comprises titanium nitride, hafnium nitride, zirconium nitride, titanium oxynitride, hafnium oxynitride, or zirconium oxynitride.

19. The via interconnect of claim 17 where said amorphous metal silicide region comprises titanium cobalt silicide, titanium nickel silicide, hafnium cobalt silicide, hafnium nickel silicide, zirconium cobalt silicide, or zirconium nickel silicide.

20. The via interconnect of claim 17 where said amorphous metal silicide region comprises titanium cobalt oxide silicide, titanium nickel oxide silicide, hafnium cobalt oxide silicide, hafnium nickel oxide silicide, zirconium cobalt oxide silicide, or zirconium nickel oxide silicide.

* * * * *

UNITED STATES PATENT AND TRADEMARK OFFICE
CERTIFICATE OF CORRECTION

PATENT NO. : 6,878,624 B1
DATED : April 12, 2005
INVENTOR(S) : John Bruley et al.

It is certified that error appears in the above-identified patent and that said Letters Patent is hereby corrected as shown below:

Column 5,
Lines 22-23, "A" should read -- Å -- (3 occurrences)

Column 8,
Line 5, "A" should read -- Å --

Signed and Sealed this

Twelfth Day of July, 2005

JON W. DUDAS
*Director of the United States Patent and Trademark Office*